(12) United States Patent
Chang et al.

(10) Patent No.: US 10,985,243 B2
(45) Date of Patent: Apr. 20, 2021

(54) CASTELLATED SUPERJUNCTION TRANSISTORS

(71) Applicants: Josephine Bea Chang, Ellicott City, MD (US); Eric J. Stewart, Silver Spring, MD (US); Ken Alfred Nagamatsu, Ellicott City, MD (US); Robert S. Howell, Silver Spring, MD (US); Shalini Gupta, Baltimore, MD (US)

(72) Inventors: Josephine Bea Chang, Ellicott City, MD (US); Eric J. Stewart, Silver Spring, MD (US); Ken Alfred Nagamatsu, Ellicott City, MD (US); Robert S. Howell, Silver Spring, MD (US); Shalini Gupta, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/992,244

(22) Filed: Aug. 13, 2020

(65) Prior Publication Data
US 2020/0373384 A1   Nov. 26, 2020

Related U.S. Application Data

(63) Continuation of application No. 16/252,952, filed on Jan. 21, 2019, now Pat. No. 10,784,341.

(51) Int. Cl.
*H01L 29/06* (2006.01)
*H01L 29/08* (2006.01)
(Continued)

(52) U.S. Cl.
CPC ...... *H01L 29/0634* (2013.01); *H01L 21/0254* (2013.01); *H01L 21/02527* (2013.01);
(Continued)

(58) Field of Classification Search
CPC ..... H01L 29/06; H01L 29/0634; H01L 29/08; H01L 29/66; H01L 29/78; H01L 29/778;
(Continued)

(56) References Cited

U.S. PATENT DOCUMENTS 5,391,895 A   2/1995   Dreifus
7,355,257 B2   4/2008   Kishimoto et al.
(Continued)

FOREIGN PATENT DOCUMENTS

EP           2202801 A2    6/2010
WO      2010016212 A1    2/2010
(Continued)

*Primary Examiner* — Chuong A Luu
(74) *Attorney, Agent, or Firm* — Tarolli, Sundheim, Covell & Tummino LLP

(57) ABSTRACT

A transistor is provided that comprises a source region overlying a base structure, a drain region overlying the base structure, and a block of semiconducting material overlying the base structure and being disposed between the source region and the drain region. The block of semiconducting material comprises a gate controlled region adjacent the source region, and a drain access region disposed between the gate controlled region and the drain region. The drain access region is formed of a plurality of semiconducting material ridges spaced apart from one another by non-channel trench openings, wherein at least a portion of the non-channel trench openings being filled with a doped material to provide a depletion region to improve breakdown voltage of the transistor.

20 Claims, 8 Drawing Sheets

(51) Int. Cl.
*H01L 23/29* (2006.01)
*H01L 23/31* (2006.01)
*H01L 29/15* (2006.01)
*H01L 29/423* (2006.01)
*H01L 21/02* (2006.01)
*H01L 21/306* (2006.01)
*H01L 29/778* (2006.01)
*H01L 29/66* (2006.01)

(52) U.S. Cl.
CPC .. *H01L 21/02576* (2013.01); *H01L 21/30612* (2013.01); *H01L 23/298* (2013.01); *H01L 23/3171* (2013.01); *H01L 29/0692* (2013.01); *H01L 29/0847* (2013.01); *H01L 29/155* (2013.01); *H01L 29/42372* (2013.01); *H01L 29/66462* (2013.01); *H01L 29/7782* (2013.01); *H01L 29/7783* (2013.01)

(58) Field of Classification Search
CPC ............... H01L 29/243; H01L 29/0696; H01L 29/7827; H01L 29/155; H01L 29/0847; H01L 29/0692; H01L 29/42372; H01L 29/66462; H01L 29/66666; H01L 29/7783; H01L 29/7782; H01L 29/4236; H01L 29/0657; H01L 29/437; H01L 29/42356; H01L 29/2003; H01L 29/78687; H01L 27/18; H01L 39/00; H01L 39/2496; H01L 23/49888; H01L 23/53285; H01L 23/3171; H01L 23/298; H01L 21/02; H01L 21/0254; H01L 21/02527; H01L 21/02576; H01L 21/30612; H01L 21/02507; H01L 21/768; H01L 21/76891
USPC .................................................. 438/22, 285
See application file for complete search history.

(56) References Cited

U.S. PATENT DOCUMENTS

| | | | |
|---|---|---|---|
| 7,781,827 B2 | 8/2010 | Rao | |
| 8,497,504 B2 * | 7/2013 | Arai | ................ H01L 29/78606 257/43 |
| 9,183,572 B2 | 11/2015 | Brubaker | |
| 9,202,906 B2 | 12/2015 | Howell et al. | |
| 9,385,224 B2 | 7/2016 | Renaldo et al. | |
| 9,419,120 B2 | 8/2016 | Nechay et al. | |
| 9,466,679 B2 | 10/2016 | Stewart et al. | |
| 9,472,634 B2 | 10/2016 | Stewart et al. | |
| 9,711,615 B2 | 7/2017 | Nechay et al. | |
| 9,755,021 B2 | 9/2017 | Renaldo et al. | |
| 9,773,897 B2 | 9/2017 | Nechay et al. | |
| 9,780,181 B1 | 10/2017 | Teo et al. | |
| 10,084,075 B2 | 9/2018 | Nechay et al. | |
| 2008/0203430 A1 | 8/2008 | Simin et al. | |
| 2009/0315037 A1 | 12/2009 | Kikkawa | |
| 2014/0264273 A1 | 9/2014 | Howell et al. | |
| 2015/0034904 A1 | 2/2015 | Fujimoto | |
| 2015/0235123 A1 | 8/2015 | Afzali-Ardakani et al. | |
| 2015/0270356 A1 | 9/2015 | Palacios et al. | |
| 2016/0035989 A1 * | 2/2016 | Afzali-Ardakani | ......................... H01L 27/3244 257/40 |
| 2016/0126340 A1 * | 5/2016 | Nechay | ............. H01L 29/66462 257/20 |
| 2016/0284828 A1 | 9/2016 | Shimizu et al. | |
| 2017/0125574 A1 | 5/2017 | Chowdhury et al. | |
| 2019/0115448 A1 | 4/2019 | Chowdhury et al. | |
| 2019/0115459 A1 | 4/2019 | Kim | |
| 2020/0058782 A1 | 2/2020 | Then et al. | |

FOREIGN PATENT DOCUMENTS

| | | |
|---|---|---|
| WO | 2010016213 A1 | 2/2010 |
| WO | 2017138398 A1 | 8/2017 |

* cited by examiner

CASTELLATED SUPERJUNCTION TRANSISTORS

RELATED APPLICATIONS

This application claims priority from U.S. patent application Ser. No. 16/252,952, filed 21 Jan. 2019, which is incorporated herein in its entirety.

TECHNICAL FIELD

The present disclosure relates generally to transistors, and more particularly to castellated superjunction transistors.

BACKGROUND

When a field-effect transistor (FET) is operated at high voltage, peak fields typically concentrate at the drain edge of the gate. The region at the drain edge of the gate is the region where electrical breakdown of the FET typically occurs. Strategies for increasing breakdown voltage typically focus on spreading the field out across a larger region, thus reducing the peak electric field. For example, a field plate structure is a typical strategy for increasing breakdown voltage in lateral devices. However, field plates introduce a large capacitance penalty which limits their usefulness for millimeter wave (mmW) applications.

The onset of electrical breakdown in a semiconductor is a function of the charge density and thus conductivity of that semiconductor, creating a trade-off between higher resistance material and higher breakdown voltage which can be predicted from intrinsic material properties. One highly successful strategy of circumvent this tradeoff is to use a superjunction, in which a charge balancing effect from mutual depletion of interspersed n-type and p-type doped regions allows the device to sustain a higher nominal breakdown without increasing its resistivity. Additionally, when high power density is dissipated within a FET, this power is converted into thermal heat, which degrades charge mobility and overall FET performance. Peak temperature typically occurs near the drain edge of the channel underneath the gate. The use of thermal dissipation layers above the device or more thermally conductive substrates below the device have been proposed to enhance lateral heat dissipation to mitigate degradation of FET performance.

SUMMARY

In one example, a transistor is provided that comprises a source region overlying a base structure, a drain region overlying the base structure, and a block of semiconducting material overlying the base structure and being disposed between the source region and the drain region. The block of semiconducting material comprises a gate controlled region adjacent the source region, and a drain access region disposed between the gate controlled region and the drain region. The drain access region is formed of a plurality of semiconducting material ridges spaced apart from one another by non-channel trench openings, wherein at least a portion of the non-channel trench openings being filled with a doped material to provide a depletion region to improve breakdown voltage of the transistor.

In another example, a super-lattice castellated field effect transistor (SLCFET) is provided. The SLCFET comprises a plurality of multichannel ridges residing over the base structure with each of the plurality of multichannel ridges comprising a plurality of heterostructures that each form a portion of a parallel channel of the multichannel ridges with the plurality of multichannel ridges being spaced apart from one another by non-channel trench openings. The SLCFET further comprises a source region that overlies the base structure and is coupled with a first end of the plurality of multichannel ridges, a drain region that overlies the base structure and is coupled with a second end of the plurality of multichannel ridges, and a gate barrier formed from the plurality of heterostructures that runs transverse to the plurality of multichannel ridges and separates the non-channel trench openings into drain-side non-channel trench openings and gate-controlled non-channel trench openings. The SLCFET further comprises a gate contact that wraps around and substantially surrounds the top and sides of each the plurality of multichannel ridges along at least a portion of its depth, filling the gate-controlled non-channel trench openings, and a doped semiconducting material disposed in the drain-side non-channel trench openings.

In yet another example, a method is provided of forming a transistor. The method comprises forming a superlattice structure having a plurality of heterostructures over a base structure and etching openings in the superlattice structure to form a plurality of multichannel ridges spaced apart from one another by non-channel trench openings. Each of the plurality of multichannel ridges are formed from a plurality of heterostructures and each having sidewalls, and a gate barrier formed from the plurality of heterostructures that runs transverse to the plurality of multichannel ridges and separates the non-channel trench openings into drain-side non-channel trench openings and gate-controlled non-channel trench openings. The method further comprises filling the drain-side non-channel trench openings with a doped semiconducting material, and forming a gate contact that wraps around and substantially surrounds the top and sides of each the plurality of multichannel ridges along at least a portion of its depth, filling the gate-controlled non-channel trench openings.

DETAILED DESCRIPTION

Figure 1:
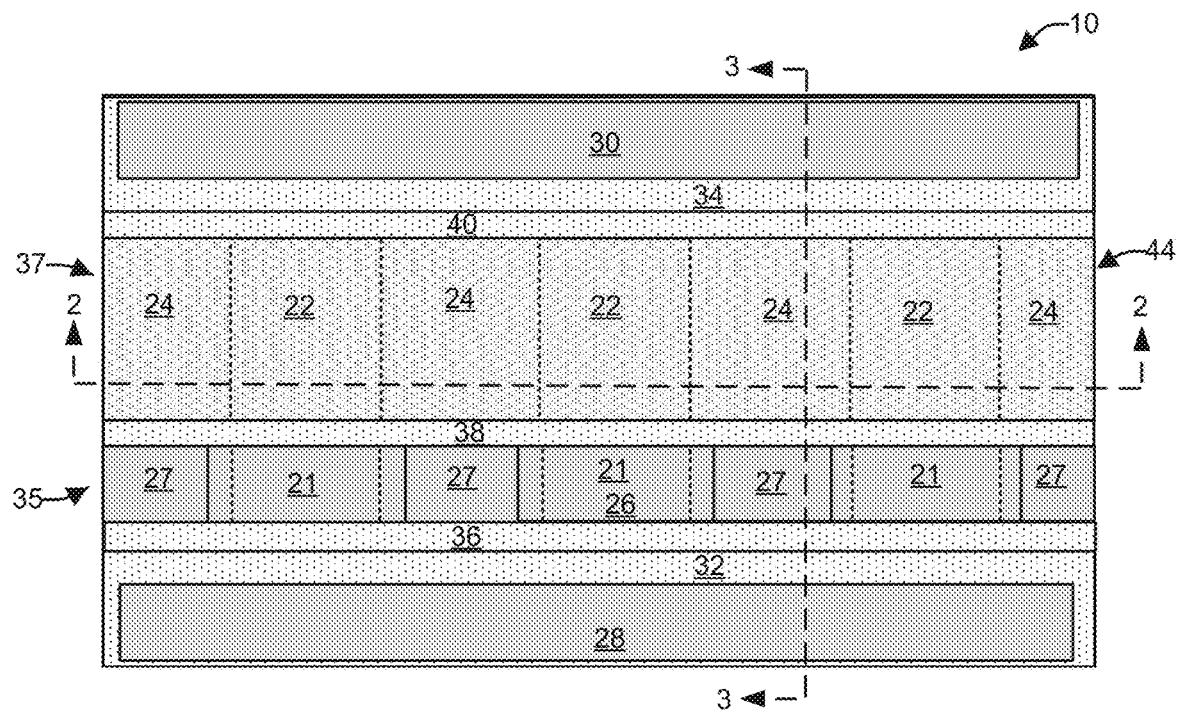
FIG. 1 illustrates a top plan view of an example superjunction superlattice castellated gate field-effect-transistor (SLCFET).

The present disclosure is related to a transistor device that employs a superjunction. In one example, the superjunction is built by filling in non-channel trench openings in a semiconductor material on the drain side of the device with a suitable material which is doped in the opposite polarity as the current-carrying ridges. For example, a boron-doped (p-type) diamond or Mg or Ca-doped (p-type) GaN material to complement ridges in which electrons are the dominant charge carriers (n-type material). This forms a depletion region between the p-type doped material and the n-type ridges in the drain access region of the device. The castellated superjunction can use a charge balancing concept in which a growing depletion region helps to create a constant electric field distribution. The castellated superjunction also functions similar to a field plate structure, for increasing breakdown voltage in the devices. However, field plates introduce a large capacitance penalty which limits their usefulness for mmW applications. An active field plate composed of a doped material such as p-diamond, however, depletes at the interface. This interface depletion region actively grows with increasing drain bias resulting in a lower capacitance penalty. The transistor can be a variety of different types of transistor such as a High-electron mobility transistor (HEMT), a metal-oxide-semiconductor FET (MOSFET), a finFET, a single heterostructure transistor, or a superlattice heterostructure transistor.

In one example, the superjunction is composed of alternating trench regions filled with doped semiconductor material and castellated semiconductor structures that are formed from a single block of semiconductor material. Each castellated semiconductor structure forms a multichannel ridge that provides a portion of the drain access region of the FET along with the unfilled trench regions. A plurality of castellated semiconductor ridges and doped semiconductor filled trenches collectively form a superjunction in the drain access region of the FET. The trench openings, referred to as non-channel trench openings, are interleaved between the multichannel ridges of the superlattice-based FET, and filled with a doped semiconductor material, such as boron-doped diamond or Ca- or Mg-doped GaN. The superjunction is located between the gate and drain of the device to facilitate improved breakdown voltage. A planar gate controls the channel formed in the single block of material between the source region and the drain region that is adjacent the drain access region.

In one example, the transistor is a superjunction superlattice castellated field effect transistor (SLCFET) device. In this example, the superjunction is composed of alternating trench regions filled with doped semiconductor material and castellated AlGaN/GaN superlattice structures that are formed of stacked n-type 2DEGs. Each superlattice structure forms a multichannel ridge that provides a castellated gate controlled region and a portion of the drain access region of the FET. The trench openings, referred to as non-channel trench openings, are interleaved between the multichannel ridges of the superlattice-based FET in the drain access region an filled with a doped semiconductor material, such as p-doped boron or diamond. The superjunction is located between the gate controlled region and drain of a SLCFET device to facilitate improved breakdown voltage. A castellated gate controls the channel formed in the castellated AlGaN/GaN superlattice structures between the source region and the drain region that is adjacent the drain access region.

In one example of a superjunction SLCFET device, the superjunction is built by filling in non-channel trench openings on the drain side of the device with a suitable p-doped material, such as boron doped diamond or Mg- or Ca-doped GaN that forms a depletion region between the p-type doped material and the castellated AlGaN/GaN superlattice structures that formed the conducting drain ridges of the device. A dielectric barrier layer may be used between the p-type doped material and the 2DEGs to prevent leakage.

In a gate-controlled region of the superjunction SLCFET device, in order to deplete out and pinch off the superlattice channels, a series of fin-like structures are etched into the superlattice, forming the multichannel ridges and the non-channel trench openings. A castellated gate contact on this structure allows the gate electric field to be applied from the sidewalls of the multichannel ridges, permitting depletion of the 2DEGs in the superlattice simultaneously from their edges. The catellated gate contact wraps around and substantially surrounds the top and sides of each of the plurality of multichannel ridges allowing the capability to turn the device off by fully depleting the 2DEGs from the sidewalls of the castellations.

Figure 2:
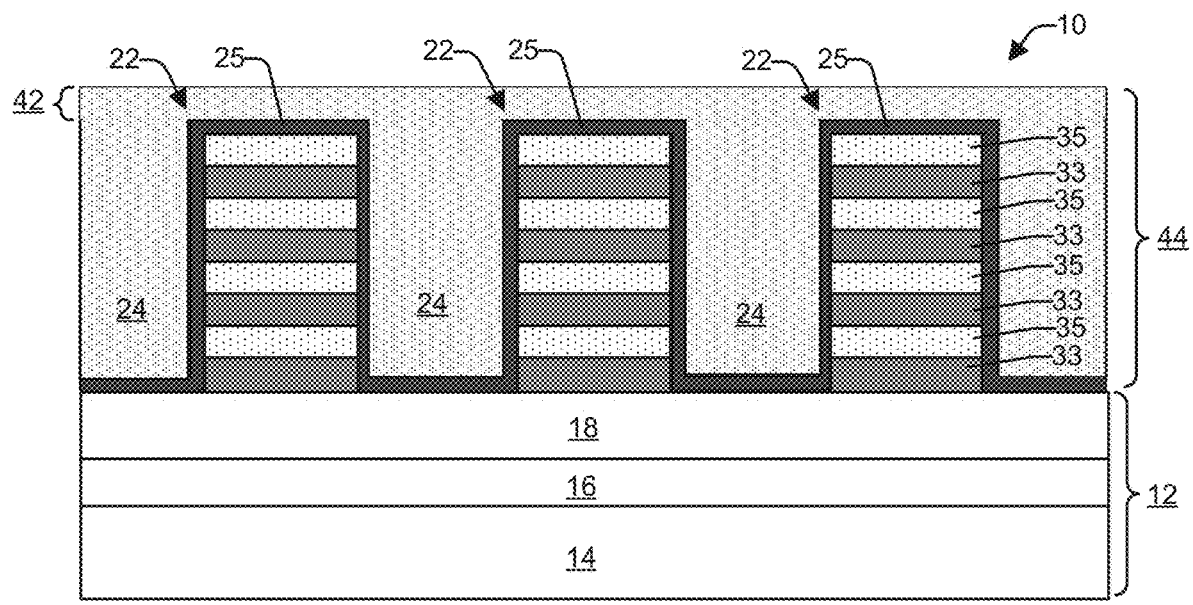
FIG. 2 illustrates a partial cross-sectional view of the example superjunction SLCFET device of FIG. 1 along the lines 2-2.
Figure 3:
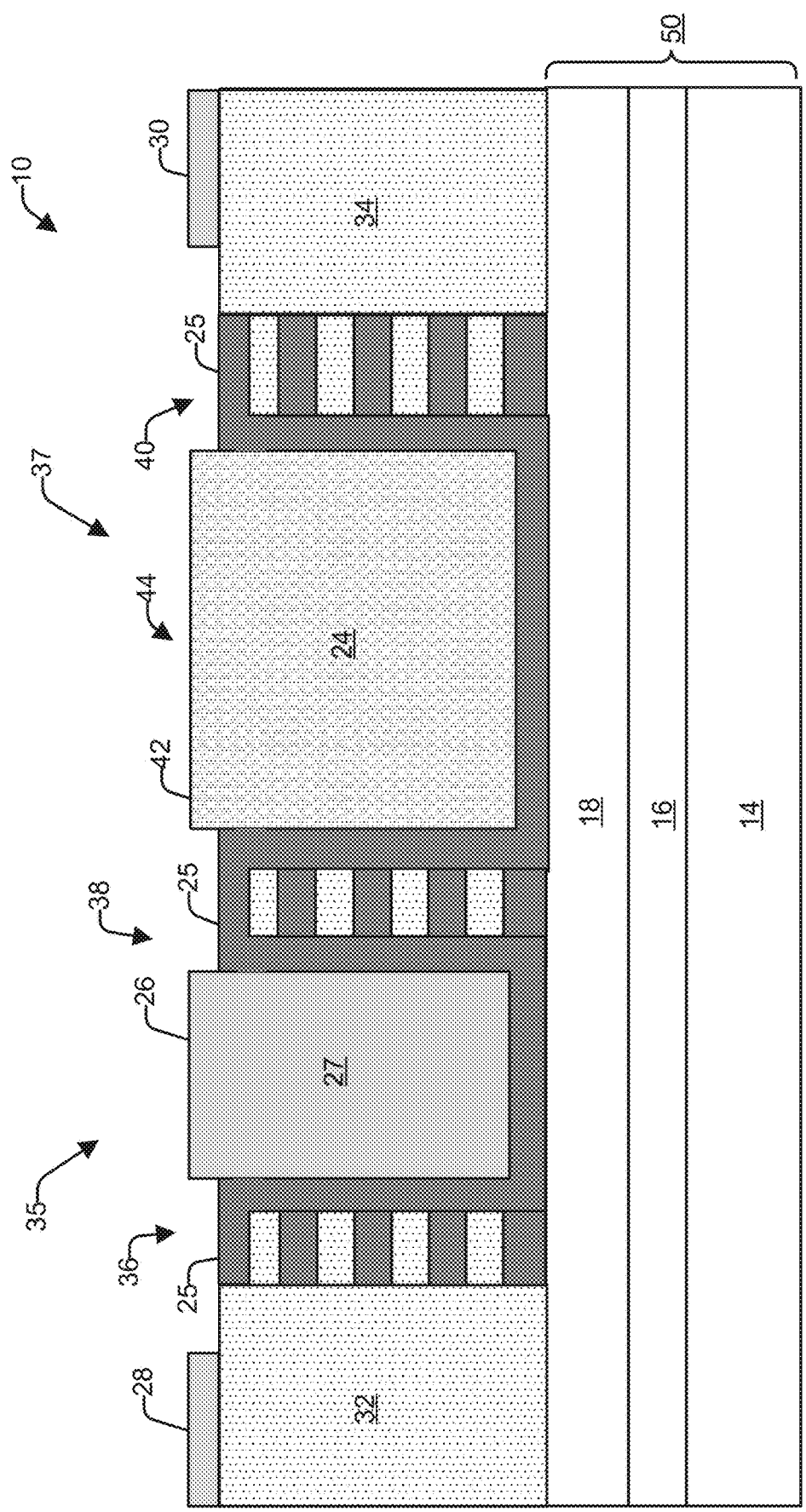
FIG. 3 illustrates a partial cross-sectional view of the example superjunction SLCFET device of FIG. 1 along the lines 3-3.
Figure 14:
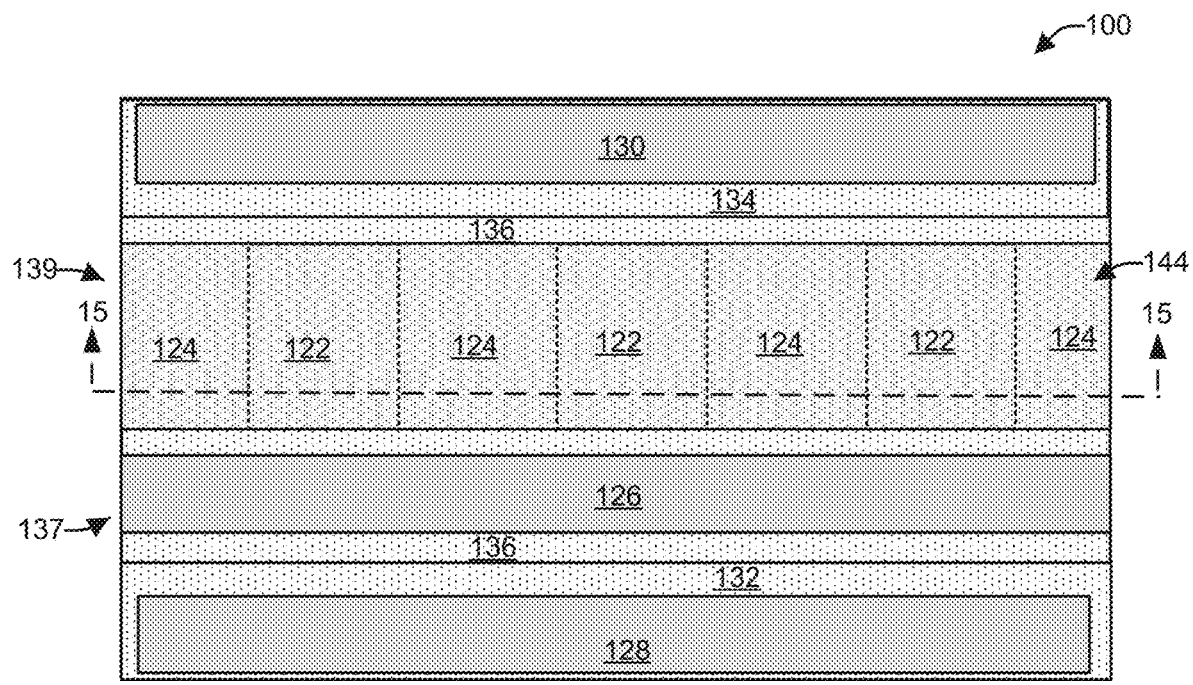
FIG. 14 illustrates a top plan view of an example transistor.
Figure 15:
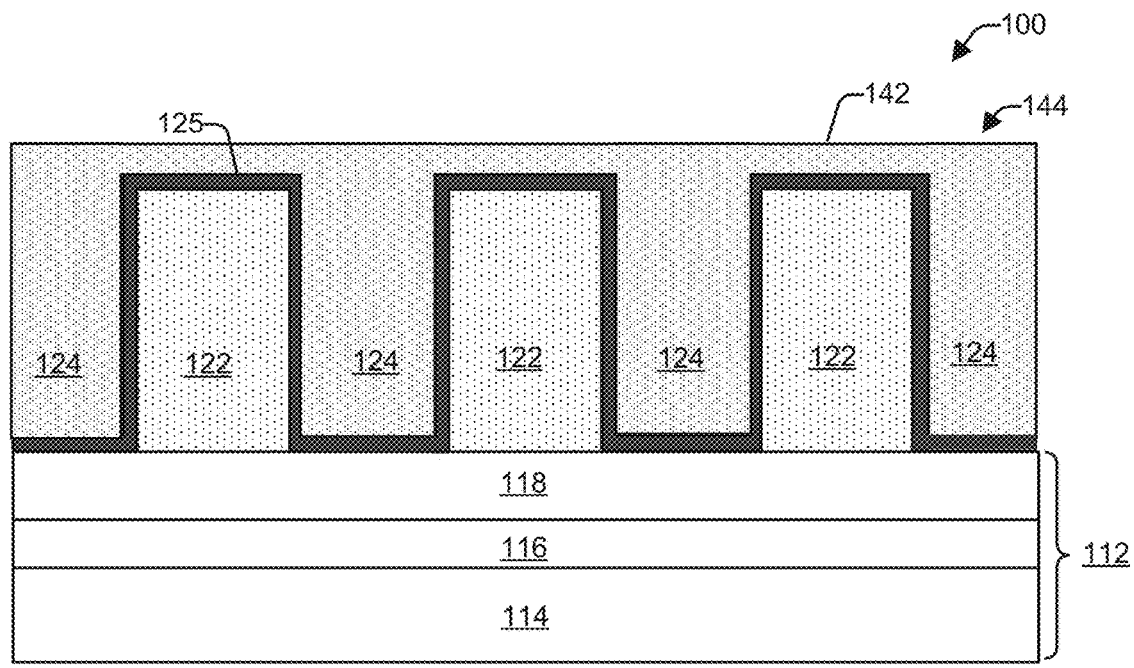
FIG. 15 illustrates a partial cross-sectional view of the example transistor of FIG. 14 along the lines 15-15.

FIGS. 1-3 illustrates different views of a SLCFET device with a superjunction, while FIGS. 4-13 illustrate a methodology for forming the SLCFET device of FIGS. 1-3. FIGS. 14-15 illustrate different views of a planar device with a superjunction.

FIG. 1 illustrates a top plan view of an example of a superjunction SLCFET device 10. FIG. 2 illustrates a partial cross-sectional view of an example of a portion of a superjunction of the superjunction SLCFET device 10 of FIG. 1 along the lines 2-2. FIG. 3 illustrates a cross-sectional view of the superjunction SLCFET device 10 of FIG. 1 along the lines 3-3. The top plan view of FIG. 1 is shown without dielectric layer 25 to facilitate viewability of the underlying layers, where the dielectric layer 25 is illustrated in FIG. 2 and FIG. 3.

Referring to FIGS. 1-3, the superjunction SLCFET device 10 includes a plurality of multichannel drain ridge 22 that extend between a gate interface 38 and a drain interface 40. Each of the plurality of multichannel drain ridges 22 include a plurality of channels formed from a plurality of heterostructures with each heterostructure being formed from an AlGaN layer overlying a GaN layer. A given heterostructure forms a portion of the castellated drain of the device 10 with the plurality of multichannel drain ridges 22 collectively forming the entire castellated drain of the device 10. The plurality of multichannel drain ridges 22 are separated from one another by drain-side non-channel openings 24 located in a superjunction region 37 located on a drain side of the device 10. A source interface 36 and a gate interface 38 defines the gate region 35, while the gate interface 38 and a drain interface 40 defines the superjunction region 37. That is the source interface 36 connects the source region 32 and the gate region 35, the gate interface 38 connects the gate region 35 and the superjunction region 37, and the drain interface 40 connects the drain region 34 and the superjunction region 37.

Each of the source interface 36, the gate interface 38, and the drain interface 40 are also formed from the plurality of heterostructures that includes stacks of an AlGaN layer overlying a GaN layer with a portion being part of the multichannel drain ridge 22 and a portion acting as interfaces to connect the respective regions and respective non-channel trench openings. As illustrated in the cross-section view of FIG. 2 and FIG. 3, each of the drain-side non-channel trench openings 24 are filled with a doped semi-conducting material. In one example, the doped semiconducting material is a p-doped material, and in another example, the p-doped material is a boron doped diamond material or a Mg- or Ca-doped GaN material. A top portion 42 of the doped material shorts each of the doped material filling the non-channel trench openings in the superjunction region 37 to one another. The doped material filling the non-channel trench openings 24 and 42 and the plurality of multichannel drain ridges 22 together form a superjunction 44.

Referring to FIGS. 1-3, the superjunction SLCFET device 10 includes a plurality of multichannel gate ridges 21 that extend between a gate interface 38 and a source interface 36. Each of the plurality of multichannel gate ridges 21 include a plurality of channels formed from a plurality of heterostructures with each heterostructure being formed from an AlGaN layer overlying a GaN layer. A given heterostructure forms a portion of the channel of the device 10 with the plurality of multichannel gate ridges 21 collectively forming the entire channel of the device 10. The plurality of multi-channel gate ridges 21 are separated from one another by gate-controlled non-channel trench openings located in a gate region 35 of the device 10. A castellated gate contact 26 extends over the multichannel gate ridges 21 and through gate-controlled non-channel trench openings 27 in the gate region 35 of the device 10. The superjunction SLCFET device 10 is in a normal "ON" state when no voltage is applied to the castellated gate contact 26, and can be turned to an "OFF" state by applying a negative voltage to the castellated gate contact 26, which in turn controls whether or not current flows through the multichannel gate ridges 21 between the source region 32 and the drain region 34 when a bias is applied between the source region 32 and the drain region 34. The source region 32 is coupled to the plurality of multichannel gate ridges 21 through the source interface 36, and the drain region 34 is coupled to the plurality of multichannel drain ridges 22 through the drain interface 40. A source contact 28 resides on top of the source region 32 and a drain contact 30 resides on top of the drain region 34.

As illustrated in FIG. 2, each multichannel drain ridge 22 includes a plurality of heterostructures 31 that overly a base 12 (base structure). Three layers may be used to construct the base 12 including a substrate layer 14, a lattice matching material layer 16, and a buffer layer 18. The substrate layer 14 can be formed of Silicon Carbide (SiC), the lattice matching material layer 16 can be formed of Aluminum Galium Nitride layer (AlGaN), and the buffer layer 18 can be formed of an undoped GaN drift region. In one example implementation, an AlGaN layer 35 overlying a GaN layer 33 form a given layer of the heterostructure 31. Each heterostructure forms a portion of a channel of the multichannel gate formed from the plurality of multichannel drain ridges 22 of the superjunction SLCFET device 10. The dielectric layer 25 (FIG. 2), for example, of silicon nitride (SiN) can overlay the superjunction SLCFET device 10, and be disposed between the plurality of multichannel drain ridges 22 and the doped material filling the non-channel trench openings 24 and 42 as well as between the plurality of multichannel gate ridges 21 and castellated gate contact 26.

The multichannel drain ridges 22 and multichannel gate ridges 21 can comprise a plurality of heterostructures that may number between 2 and K, where K is defined as the maximum number of heterostructures that can be grown, deposited or otherwise formed on each other without cracking or other mechanical failure in the layers or 2DEG channels. One of ordinary skill in the art appreciates that several values including the value of K, relative positions of AlGaN and GaN may be reversed, other suitable materials may be used, and other parameters, options, and the like that are desirable may be used to implement the multichannel drain ridges 22 and multichannel gate ridges 21. By stacking a plurality of these two-material heterostructures, and with the addition of appropriate doping in the layers to maintain the presence of the 2DEG or 2DHG channels when stacking a plurality of heterostructure layers, the sheets of charge are able to act in parallel, allowing for greater current flow through each heterostructure.

Carriers, which form a 2DEG in a standard channel of AlGaN/GaN, may be spontaneously generated and maintained due to piezoelectric and spontaneous polarization, or introduced with doping. For example, the AlGaN barrier is strained by virtue of its epitaxial relationship with the GaN channel and since these materials are piezoelectric, free carriers are generated in the channel. The strain state of barrier and channel layers used, in some examples, may control the carrier concentration in the AlGaN/GaN heterostructures. One of ordinary skill in the art understands that precise control of composition, thickness, and the ordering of the AlGaN and GaN layers provides for the precise control of the production of the superjunction SLCFET device 10. An epitaxial scheme and device fabrication method may exploit this phenomenon.

In various example manufacturing methods and techniques of producing various superjunction SLCFETs and other high voltage FETs the various example methods disclosed herein can provide for optimization of one or more device parameters such as, for example, the breakdown voltage, a pinch-off voltage, linearity and other device parameters. For example, the superjunction SLCFET device 10 can be a used for a variety of applications such as time delay units, low loss phase shifters and attenuators, switch matrices, T/R switches, circulator replacements or as amplifiers, and the like. Though such multi-channel devices offer low on-state resistance, power consumption and related voltages can be very high and sometimes high enough to cause these devices to fail when operating at high voltages and high power.

Figure 4:
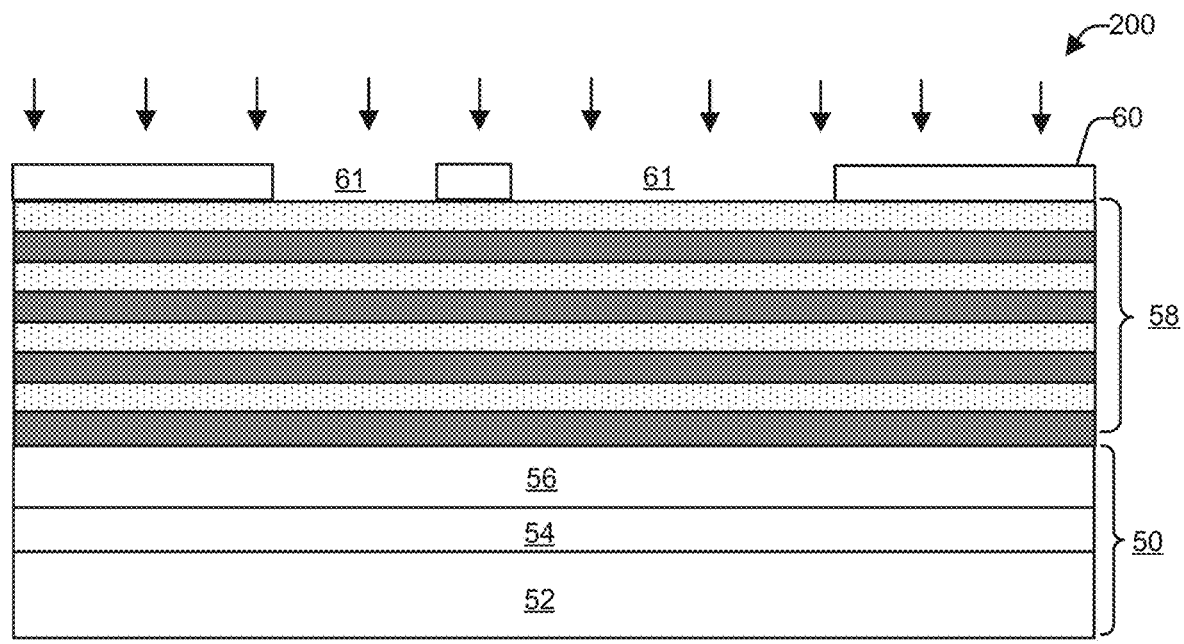
FIG. 4 illustrates an example cross-sectional view of a superjunction SLCFET early in the manufacturing process after formation of a mask over a superlattice structure and while undergoing an etch process.
Figure 5:
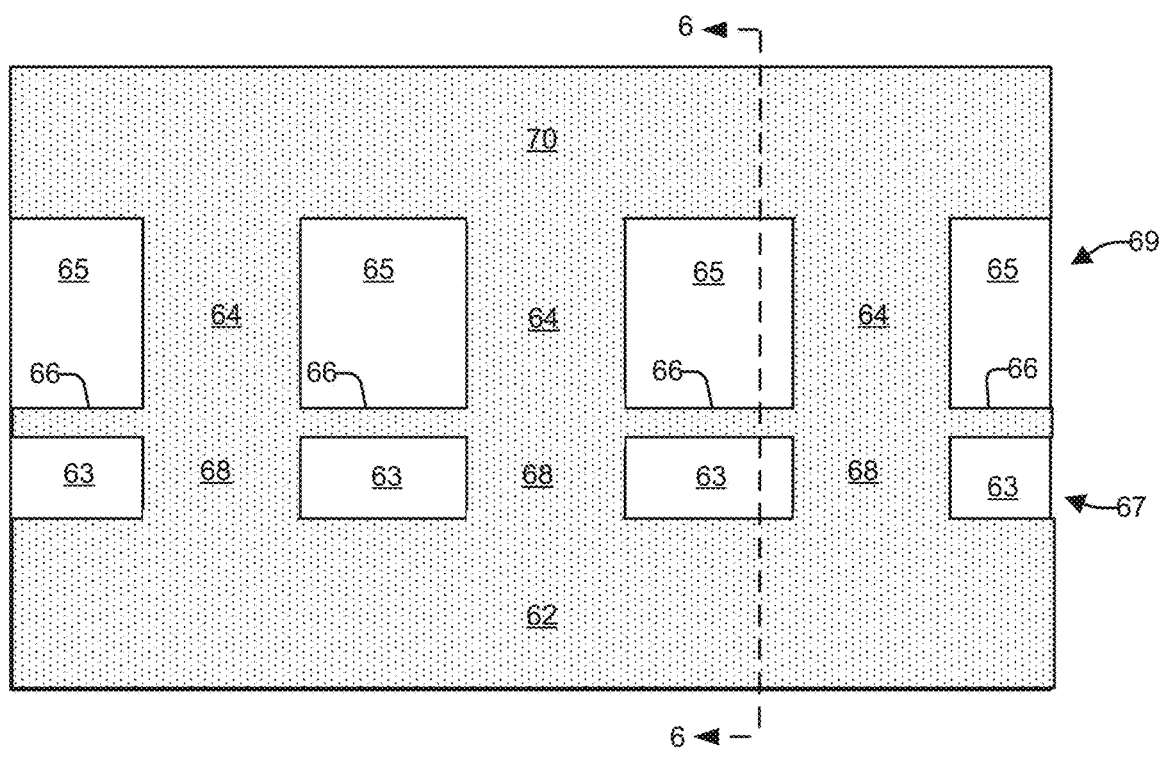
FIG. 5 illustrates an example top plan view of the superjunction SLCFET of FIG. 4 after undergoing the etch process of FIG. 4.
Figure 6:
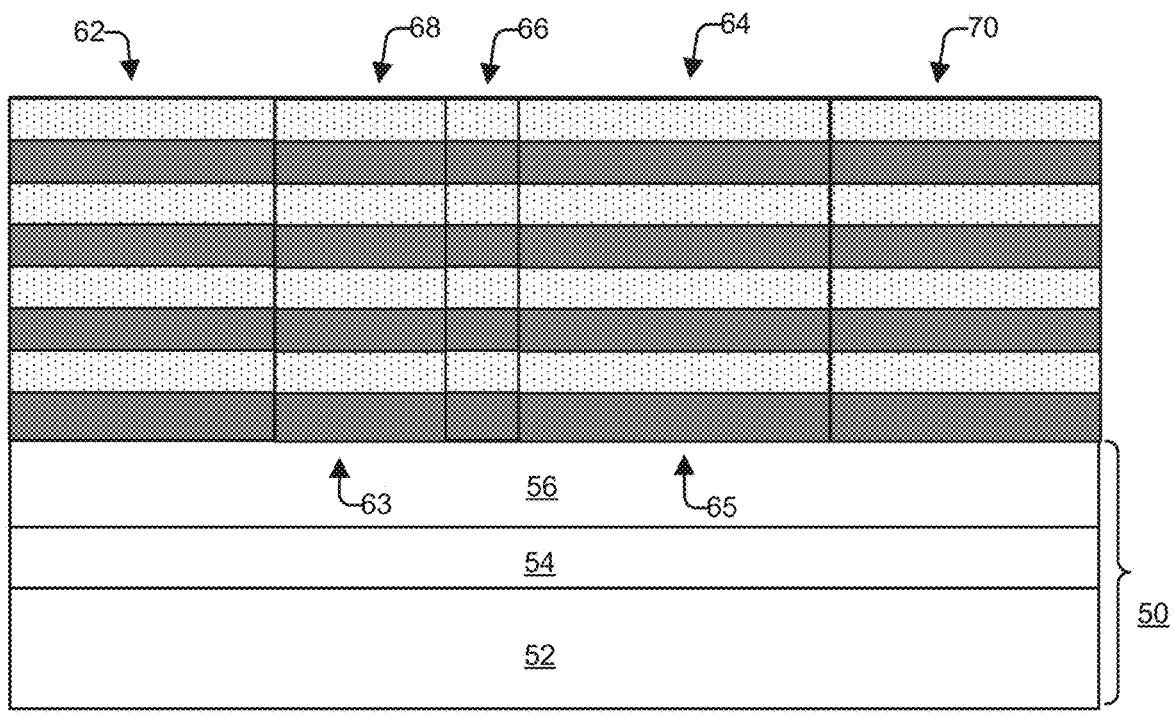
FIG. 6 illustrates an example cross-sectional view of the superjunction SLCFET of FIG. 4 after undergoing the etch process of FIG. 4.

FIGS. 4-13, illustrate an example method of fabrication in connection with formation of the example superjunction SLCFET device illustrated in FIGS. 1-3. FIG. 4 illustrates a cross-sectional view of a superjunction SLCFET device in its early stages of fabrication starting with a base structure 50. As discussed earlier, three layers may be used to construct the base structure 50 including a substrate layer 52, a lattice matching material layer 54, and a buffer layer 56.

A superlattice heterostructure 58 has been fabricated across the entire upper surface of the buffer layer 56 resulting in the structure of FIG. 4. In one example implementation, each heterostructure is formed from an AlGaN layer overlying a GaN layer. Example methods of fabrication involve sequential growth of multichannel profiles in a monolithic epitaxial scheme known by those of ordinary skill in the art. By sequentially growing the epitaxial multichannel layers that will later become devices and appropriate doping, all devices fabricated from this structure will benefit from the inherently high quality material properties, atomically flat interfaces and compositional control associated with epitaxial growth.

The epitaxial growth of different materials upon each other may optionally be enhanced with appropriate deposition technique(s) until the layered heterostructures illustrated in FIG. 4 has been produced. Any suitable technique for depositing each layer can be employed such as metal organic chemical vapor deposition (MOVCD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques, or other suitable deposition techniques.

An etch mask 60 has been formed overlying the superlattice heterostructure 58. The etch mask 60 can be formed by depositing, patterning and developing a photoresist material layer over the superlattice heterostructure 58. The etch mask 60 specifies (unblocks) areas 61 where openings 63 and 65 (FIG. 5) are to be formed. Additionally, FIG. 4 illustrates the structure undergoing an etch process 200 to form the openings 63 and 65. The etch process 200 employing the etch mask 60 is used to form a plurality of multichannel drain ridges 64, multichannel gate ridges 68 and non-channel trench openings 63 and 65 from the superlattice heterostructure 58, as illustrated in the plan view of FIG. 5. The superlattice heterostructure remains in source area 62 and drain area 70. The etch mask 60 can then be removed to provide the resultant structure illustrated in the top plan view of FIG. 5 and the cross-sectional view of FIG. 6 along the lines 6-6 of FIG. 5. In particular, the etch process forms gate-controlled non-channel trench openings 63 located in a gate region 67 and drain-side non-channel trench openings 65 located in a superjunction region 69. A gate interface 66 remains to connect the gate region 67 and superjunction region 69 and separate the gate-controlled non-channel trench openings 63 and the drain-side non-channel trench openings 65.

Techniques for forming alternating multichannel ridges and non-channel trench openings are disclosed in commonly owned U.S. Pat. No. 9,419,120, entitled, "Multichannel Devices with Improved Performances and Methods of Making the Same", and commonly owned U.S. Pat. No. 9,773,897, entitled, "Multichannel Devices with Gate Structures to Increase Breakdown Voltage", both of which are herein incorporated by reference in their entirety herein.

Figure 7:
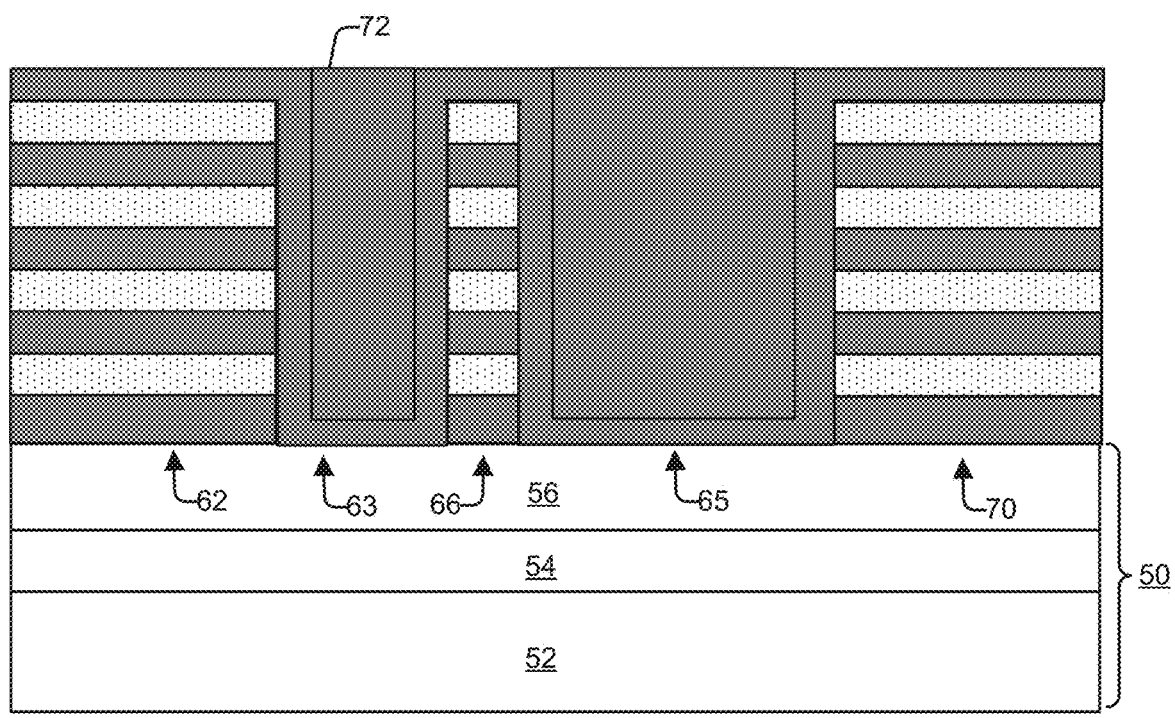
FIG. 7 illustrates an example cross-sectional view of the superjunction SLCFET device of FIG. 6 after deposition of a dielectric material layer.

Next, a gate dielectric deposition process is performed to cover the device with a dielectric material layer 72 to provide the resultant structure of FIG. 7. The dielectric material layer 72 prevents leakage between the gate and the 2DEG layers formed in the superlattice. The dielectric material layer 72 also eliminates leakage between the doped material to be deposited in the drain-side non-channel trench openings 65 and the 2DEGs in the multichannel drain ridges 64.

Figure 8:
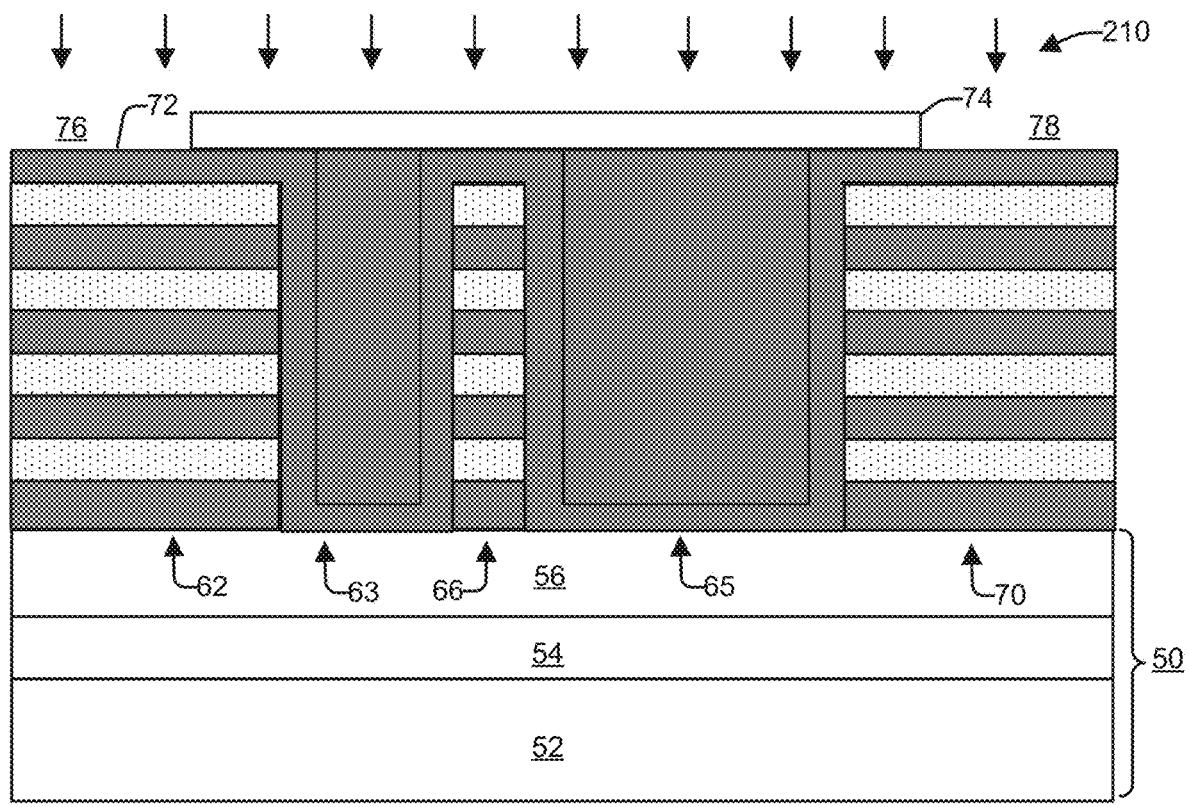
FIG. 8 illustrates an example cross-sectional view of the superjunction SLCFET device of FIG. 7 after formation of a mask and while undergoing an etch process.
Figure 9:
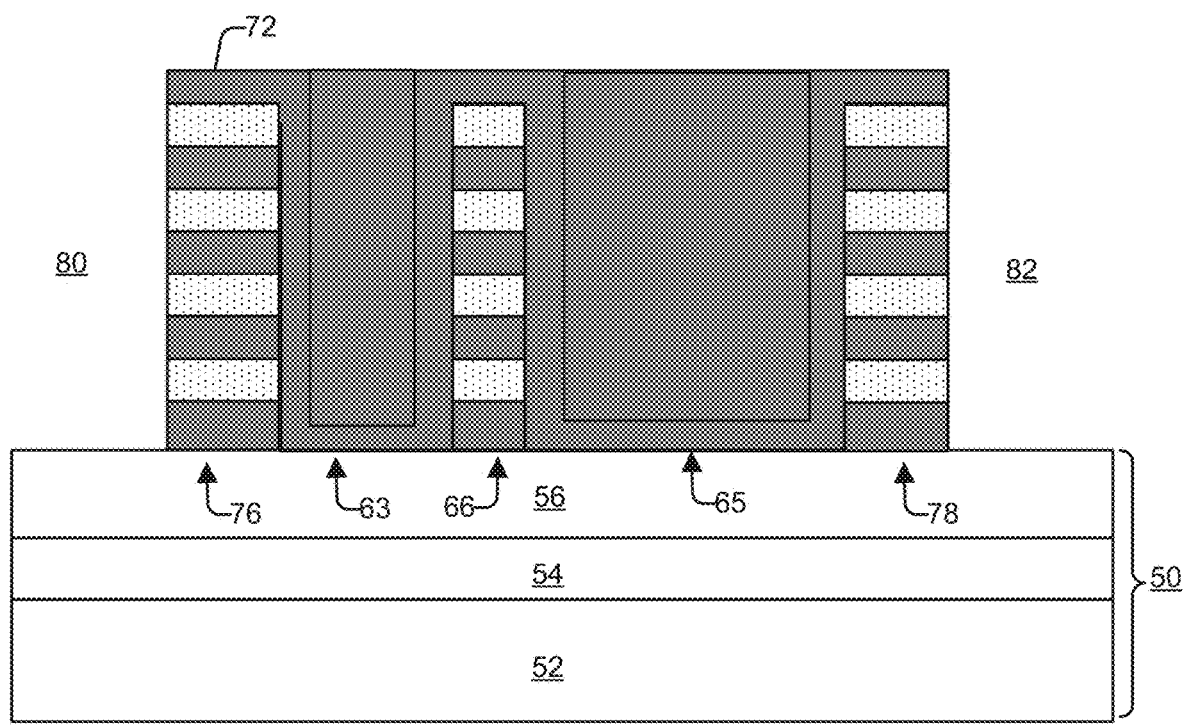
FIG. 9 illustrates an example cross-sectional view of the superjunction SLCFET device of FIG. 8 after undergoing the etch process of FIG. 8.

FIG. 8 illustrates formation of an etch mask 74 with patterned openings 76 and 78 over the structure of FIG. 7. Additionally, FIG. 8 illustrates the structure undergoing an etch process 210 to form the openings 80 and 82 for depositing or regrowing heavily doped ohmic contact material in the openings 80 and 82. The resultant structure is illustrated in FIG. 9 after the etch process 210 has been completed, and the etch mask removed. Next, the structure of FIG. 9 undergoes a deposition or regrowth process to fill the openings 80 and 82 with heavily doped material such as n+ doped Gallium Nitride (GaN) to form source region 84 and drain region 86, and provide the resultant structure of FIG. 10. A source interface 76 remains that connects the source-side non-channel trench openings 63 from the source region, and a drain interface 78 connects the drain-side non-channel trench openings 65 from the drain region 86.

Figure 10:
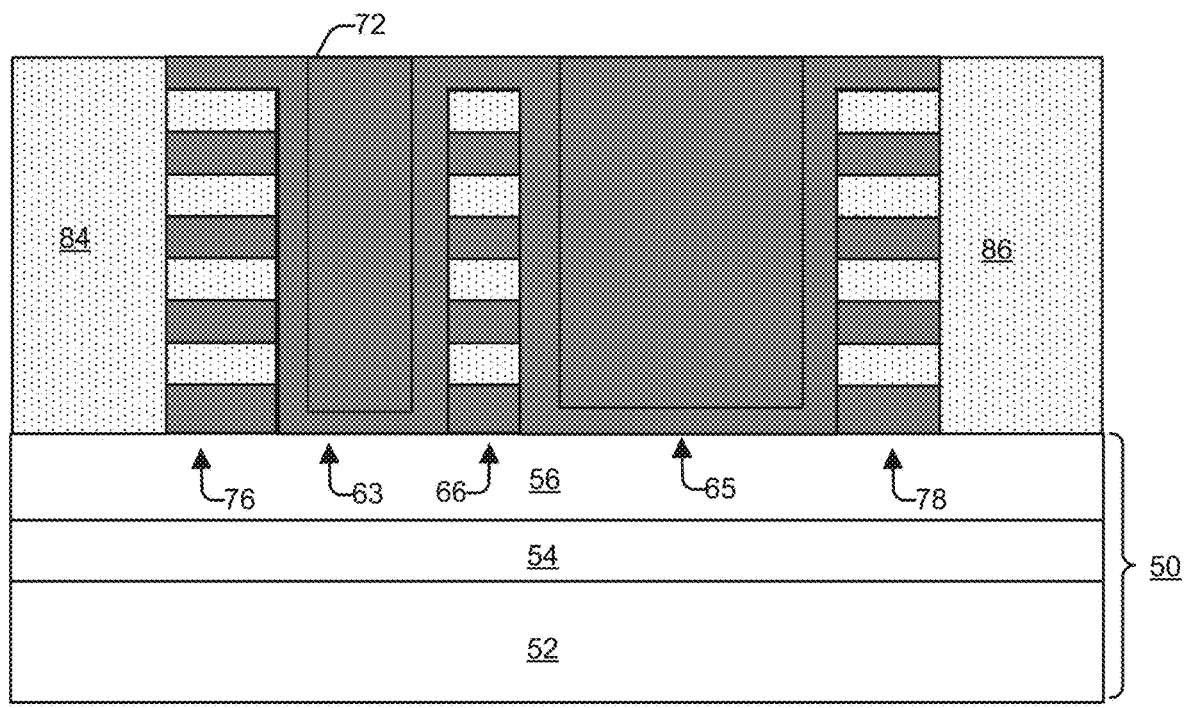
FIG. 10 illustrates an example cross-sectional view of the superjunction SLCFET device of FIG. 9 after a material fill or regrowth process to form source and drain regions.
Figure 11:
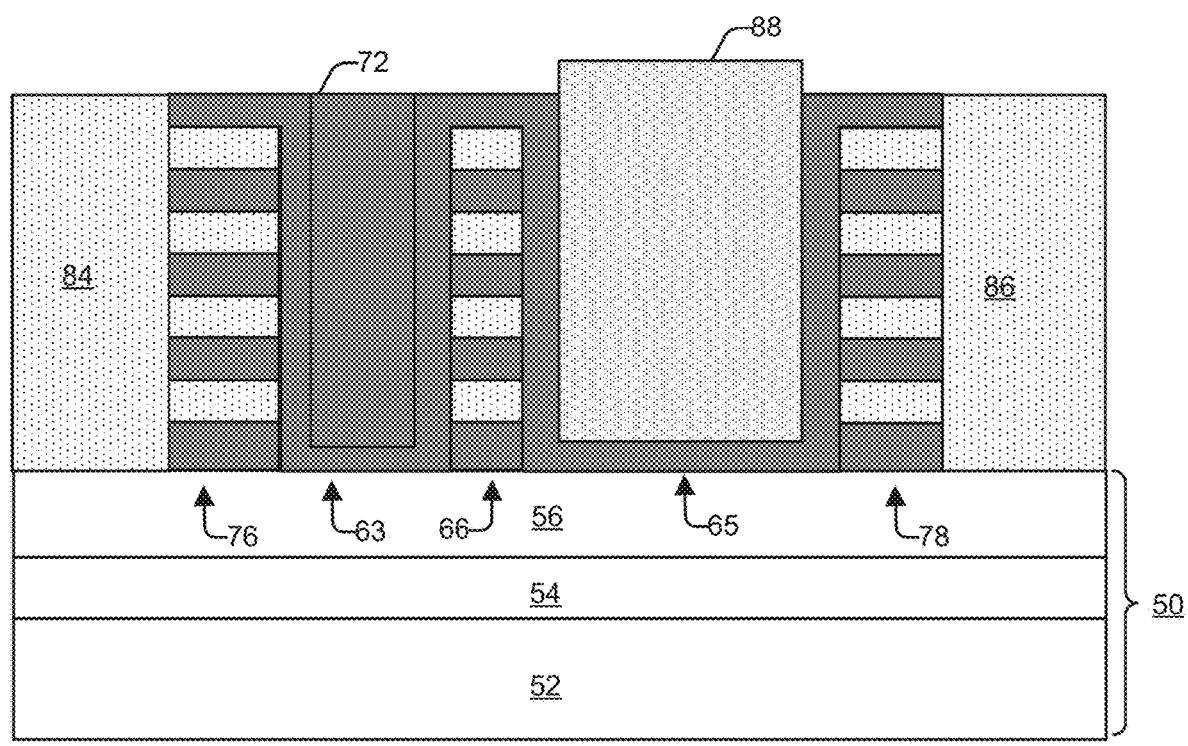
FIG. 11 illustrates an example cross-sectional view of the superjunction SLCFET device of FIG. 10 after a material fill process to fill drain-side non-channel openings with a doped material.

Next, the structure of FIG. 10 undergoes a doped semiconducting material fill process to fill drain-side non-channel trench openings 65 located in a superjunction region 69. The doped semiconducting material can be a p-type doped material. The p-type doped material can be a boron doped diamond material or a Mg- or Ca-doped GaN material. A depletion region forms during device operation between the doped semiconducting material and the castellated AlGaN/GaN superlattice structures that form the castellated drain access region of the device. Any suitable technique for depositing the doped material can be employed such as metal organic chemical vapor deposition (MOVCD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques, or other suitable deposition techniques. The resultant structure is illustrated in the cross-sectional view of FIG. 11, and the top plan view of FIG. 12 showing doped material filled drain-side non-channel trench openings 88.

Figure 12:
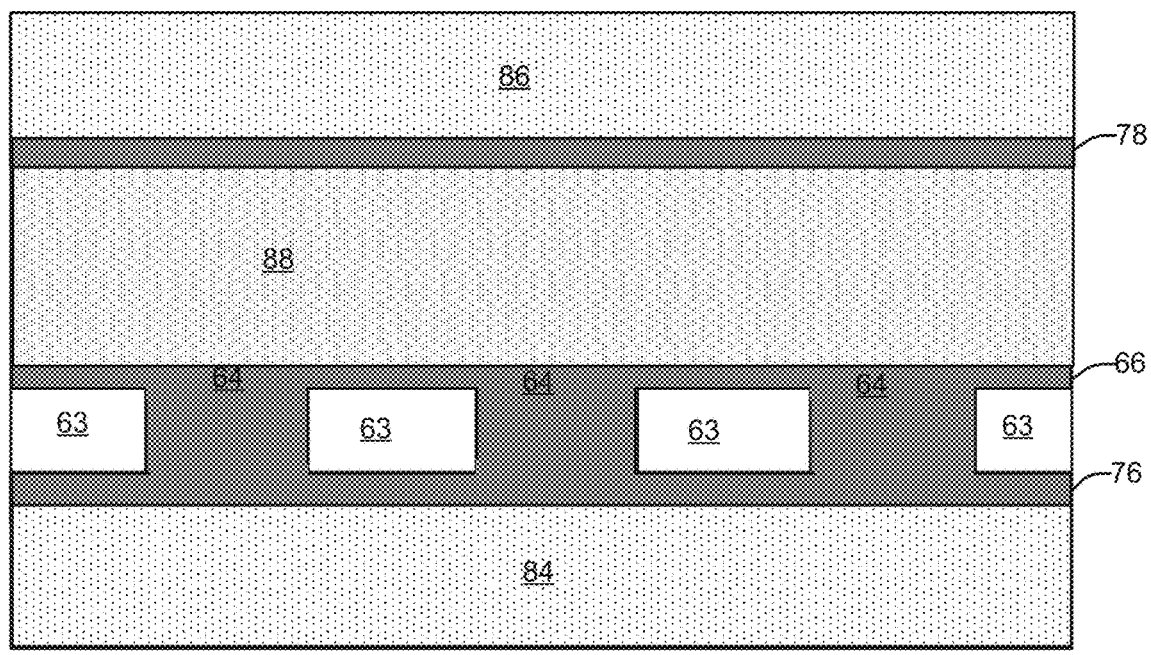
FIG. 12 illustrates top plan view of the superjunction SLCFET device of FIG. 10 after the material fill process to fill drain-side non-channel openings with a doped material.
Figure 13:
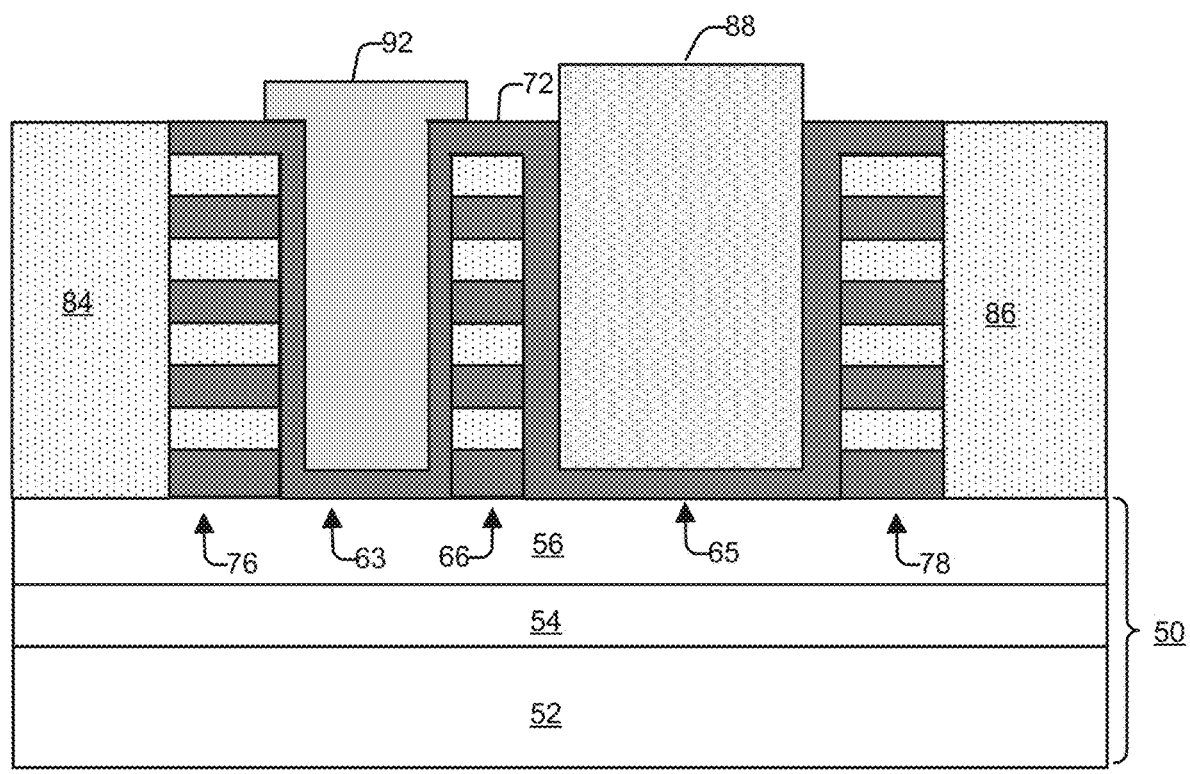
FIG. 13 illustrates a cross-sectional view of the structure of FIG. 11 after formation of a source contact, a drain contact and a castellated gate contact.

FIG. 13 illustrates the structure of FIG. 12 after a contact formation process to form a source contact 90 on top of the n+ regrowth source region 84 and a drain contact 94 on top of the n+ growth drain region 86. Concurrently, previously or subsequently, a castellated gate contact 92 is formed over the multichannel ridges 64 and through the source-side non-channel openings 63 in the gate region 67 of the device. Photodeposition patterning and metallization processes can be employed to form the source contact 90, the drain contact 94, and the castellated gate contact 92. A plan view of the resultant structure of FIG. 13 would be substantially similar to the device illustrated in FIG. 1. A passivation layer (not shown) (e.g., diamond layer) can then be formed over the top of the structure to protect the device from contaminants.

FIG. 14 illustrates a top plan view of an example of a transistor device 100 with a block of semiconducting material disposed between a source region 132 and a drain region 134. The block of semiconducting material can be formed of one layer, a number of layers, heterostructure or a superheterostructure. The transistor device 100 can be a MOSFET, a finFET, a HEMT, a single heterojunction device, a multiple heterojunction transistor device, or any of a variety of other field effect transistor architectures. FIG. 15 illustrates a partial cross-sectional view of an example of a portion of the superjunction FET device 100 of FIG. 1 along the lines 15-15.

Referring to FIG. 14-15, the FET device 100 includes the source region 132 overlying a base structure 112, the drain region 134 overlying the base structure 112, and a block of semiconducting material 136 overlying the base structure 112 and being disposed between the source region 132 and the drain region 134. Three layers may be used to construct the base 112 including a substrate layer 114, a lattice matching material layer 116, and a buffer layer 118. The block of semiconducting material comprises a gate controlled region 137 adjacent the source region 132, and a drain access region 139 disposed between the gate controlled region 137 and the drain region 134. The drain access region is formed of a plurality of semiconducting material ridges 122 spaced apart from one another by non-channel trench openings 124, wherein at least a portion of the non-channel trench openings 124 are filled with a doped material. A top portion 142 of the doped material shorts each of the doped material filled non-channel trench openings 124 in the superjunction region 137 to one another. Together, the doped material 124 and 142 and the semiconducting material ridges 122 form a superjunction 144. A source contact 128 resides on top of the source region 132 and a drain contact 130 resides on top of the drain region 134. A planar gate contact 126 resides over the block of semiconductor material in the gate controlled region to control the current flowing between the source contact 128 and the drain contact 130.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method of forming a transistor, the method comprising:
    etching openings in a superlattice structure comprising a plurality of heterostructures over a base structure to form a plurality of multichannel gate ridges spaced apart from one another by gate-controlled non-channel trench openings, each of the plurality of multichannel gate ridges being formed from the plurality of heterostructures and each having sidewalls, a plurality of multichannel drain ridges spaced apart from one another by drain-side non-channel trench openings, each of the plurality of multichannel drain ridges being formed from the plurality of heterostructures and each having sidewalls, and a gate interface formed from the plurality of heterostructures that runs transverse to the plurality of multichannel gate ridges and multichannel drain ridges and separates the drain-side non-channel trench openings from the gate-controlled non-channel trench opening;
    filling the drain-side non-channel trench openings with a doped semiconducting material; and
    forming a gate contact that wraps around and substantially surrounds the top and sides of each the plurality of multichannel ridges along at least a portion of its depth, filling the gate-controlled non-channel trench openings.

2. The method of claim 1, wherein each heterostructure is formed from an AlGaN layer and a GaN layer, wherein the AlGaN layer is doped.

3. The method of claim 1, wherein the doped semiconducting material is boron doped diamond.

4. The method of claim 1, wherein the doped semiconducting material is Mg- or Ca-doped GaN.

5. The method of claim 1, wherein etching openings in a superlattice structure comprises forming an etch mask over the superlattice structure to provide respective areas for forming the gate-controlled non-channel trench openings and the drain-side non-channel trench openings.

6. The method of claim 5, wherein the etching of the openings in the superlattice structure forms the gate-controlled non-channel trench openings in a gate region and the drain-side non-channel trench openings in a superjunction region.

7. The method of claim 6, wherein the gate interface connects the gate region and the superconducting region.

8. The method of claim 6, wherein forming an etch mask over the superlattice structure comprises employing the etching mask to form the plurality of multichannel drain ridges, the plurality of multichannel gate ridges and the gate-controlled and the drain-side non-channel trench openings.

9. The method of claim 6, wherein the etch mask is a first etch mask, and the method further comprises forming a second etch mask to form patterned openings over respective portions of the superlattice structure.

10. The method of claim 9, wherein the doped semiconducting material is a first doped semiconducting material, and the method further comprises:
    etching the respective portions of the superlattice structure to form source and drain openings; and
    filling the source and drain openings with a second doped semiconducting material to form source and drain regions.

11. The method of claim 10, wherein the second doped semiconducting material is doped Gallium Nitride.

12. The method of claim 10, wherein the source region is connected via a source interface to source-side non-channel trench openings and the drain region is connected via a drain interface to the drain-side non-channel trench openings.

13. The method of claim 10, wherein the drain-side non-channel trench openings are filled with the first doped semiconducting material in response to filling the source and the drain openings with the second doped semiconducting material.

14. The method of claim 13, wherein the first doped semiconducting material is a boron doped diamond or is Mg- or Ca-doped GaN.

15. The method of claim 14, wherein forming the gate contact comprises forming a castellated gate contact over the plurality of multichannel drain ridges and through source-side non-channel openings in the gate region.

16. The method of claim 15, further comprising forming the superlattice structure comprising the plurality of heterostructures over the base structure.

17. The method of claim 1, further comprising:
    etching a source opening on a source side of the plurality of multichannel gate ridges and a drain opening on the drain-side of the plurality of multichannel ridges; and filling the source opening and drain opening with a doped material to form a drain region and a source region.

18. The method of claim 17, further comprising forming a source contact disposed over the source region and a drain contact disposed over the drain region.

19. The method of claim 18, wherein forming the gate contact comprises forming a castellated gate contact over the plurality of multichannel drain ridges and through the source-side non-channel openings in a gate region.

20. The method of claim 19, wherein the doped semiconducting material is a boron doped diamond or is Mg- or Ca-doped GaN.

* * * * *